US010629463B2

(12) United States Patent
Momma et al.

(10) Patent No.: US 10,629,463 B2
(45) Date of Patent: Apr. 21, 2020

(54) THERMAL PROCESSING APPARATUS AND THERMAL PROCESSING METHOD

(71) Applicant: SCREEN Holdings Co., Ltd., Kyoto (JP)

(72) Inventors: Toru Momma, Kyoto (JP); Yasuhiro Fukumoto, Kyoto (JP); Koji Nishi, Kyoto (JP); Shigehiro Goto, Kyoto (JP); Kenichiro Jo, Kyoto (JP); Atsushi Tanaka, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 177 days.

(21) Appl. No.: 15/556,919

(22) PCT Filed: Nov. 17, 2015

(86) PCT No.: PCT/JP2015/005727
§ 371 (c)(1),
(2) Date: Sep. 8, 2017

(87) PCT Pub. No.: WO2016/151651
PCT Pub. Date: Sep. 29, 2016

(65) Prior Publication Data
US 2018/0033660 A1  Feb. 1, 2018

(30) Foreign Application Priority Data
Mar. 26, 2015 (JP) ................. 2015-063949

(51) Int. Cl.
H01L 21/67 (2006.01)
H01L 21/027 (2006.01)
(Continued)

(52) U.S. Cl.
CPC ........ H01L 21/67248 (2013.01); F25B 21/04 (2013.01); H01L 21/027 (2013.01);
(Continued)

(58) Field of Classification Search
CPC ............ H01L 21/67248; H01L 21/027; H01L 21/324; H01L 21/67103; H01L 22/20; F25B 21/04; F25B 2321/0212
(Continued)

(56) References Cited

U.S. PATENT DOCUMENTS 5,522,215 A  6/1996 Matsunaga et al. ............... 62/32
5,638,687 A  6/1997 Mizohata et al. ................ 62/62
(Continued)

FOREIGN PATENT DOCUMENTS

CN  1685476 A  10/2005
CN  101127298 A  2/2008
(Continued)

OTHER PUBLICATIONS

International Search Report dated Jan. 19, 2016 in corresponding PCT International Application No. PCT/JP2015/005727.
(Continued)

Primary Examiner — Justin M Jonaitis
(74) Attorney, Agent, or Firm — Ostrolenk Faber LLP

(57) ABSTRACT

An upper plate on which a substrate is placed is cooled or heated by a thermal processor. The temperature of the thermal processor is adjusted by a temperature adjuster. The temperature of the upper plate is detected. A control value that is to be applied to the temperature adjuster in order to maintain the temperature of the upper plate at a set value is calculated as a control arithmetic value on the basis of the detected temperature. When the control arithmetic value decreases to a value less than a second threshold value, a first control that applies the control arithmetic value to the temperature adjuster is performed. When the control arithmetic value increases to a value not less than a first threshold
(Continued)

value, a second control that applies a control set value higher than the control arithmetic value to the temperature adjuster is performed.

8 Claims, 5 Drawing Sheets

(51) Int. Cl.
    *F25B 21/04* (2006.01)
    *H01L 21/324* (2006.01)
    *H01L 21/66* (2006.01)

(52) U.S. Cl.
    CPC ...... *H01L 21/324* (2013.01); *H01L 21/67103* (2013.01); *H01L 22/20* (2013.01); *F25B 2321/0212* (2013.01)

(58) Field of Classification Search
    USPC ....... 62/3.3, 3.1; 219/444.1, 446.1; 118/724, 118/725
    See application file for complete search history.

(56) References Cited

U.S. PATENT DOCUMENTS

| | | | | |
|---|---|---|---|---|
| 6,080,969 | A * | 6/2000 | Goto | H01L 21/67103 219/444.1 |
| 6,191,399 | B1 * | 2/2001 | Van Bilsen | G01J 5/00 118/725 |
| 6,230,497 | B1 * | 5/2001 | Morris | F25B 21/04 257/E23.08 |
| 2004/0250762 | A1 | 12/2004 | Shigetomi et al. | 118/684 |
| 2008/0046111 | A1 | 2/2008 | Kataoka et al. | 700/207 |
| 2011/0210116 | A1 | 9/2011 | Shigetomi et al. | 219/494 |
| 2012/0064469 | A1 | 3/2012 | Yoshii et al. | 432/24 |
| 2013/0065189 | A1 | 3/2013 | Yoshii et al. | 432/9 |
| 2013/0098085 | A1 | 4/2013 | Judge et al. | 62/180 |
| 2013/0098086 | A1 | 4/2013 | Sillato et al. | 62/184 |
| 2013/0098087 | A1 | 4/2013 | Noll et al. | 62/222 |
| 2013/0098088 | A1 | 4/2013 | Lin et al. | 62/228.1 |
| 2014/0033753 | A1 | 2/2014 | Lu et al. | 62/190 |
| 2014/0202680 | A1 | 7/2014 | Kusachi et al. | 165/287 |
| 2015/0230367 | A1 | 8/2015 | Judge et al. | |
| 2016/0061495 | A1 | 3/2016 | Sillato et al. | |

FOREIGN PATENT DOCUMENTS

| | | |
|---|---|---|
| CN | 100367458 C | 6/2008 |
| CN | 102194662 A | 9/2011 |
| CN | 102299047 A | 12/2011 |
| CN | 102403195 A | 4/2012 |
| CN | 103609206 A | 2/2014 |
| CN | 103712465 A | 4/2014 |
| CN | 103940094 A | 7/2014 |
| JP | 07-115058 A | 5/1995 |
| JP | 08-148421 A | 6/1996 |
| JP | 08-203796 A | 8/1996 |
| JP | 08-236414 A | 9/1996 |
| JP | 08-273993 A | 10/1996 |
| JP | 10-335209 A | 12/1998 |
| JP | 2005-33178 A | 2/2005 |
| JP | 2013-016595 A | 1/2013 |
| TW | 201342473 A | 10/2013 |
| TW | 201415556 A | 4/2014 |

OTHER PUBLICATIONS

Written Opinion dated Jan. 19, 2016 in corresponding PCT International Application No. PCT/JP2015/005727.

* cited by examiner

THERMAL PROCESSING APPARATUS AND THERMAL PROCESSING METHOD

CROSS-REFERENCE TO RELATED APPLICATIONS

The present application is a 35 U.S.C. §§ 371 national phase conversion of PCT/JP2015/005727, filed Nov. 17, 2015, which claims priority to Japanese Patent Application No. 2015-063949, filed Mar. 26, 2015, the contents of both of which are incorporated herein by reference. The PCT International Application was published in the Japanese language.

TECHNICAL FIELD

The present invention relates to a thermal processing apparatus and a thermal processing method for performing thermal processing on substrates.

BACKGROUND ART

Thermal processing apparatuses are used to perform thermal processing on various substrates such as semiconductor substrates, substrates for liquid crystal displays, substrates for plasma displays, substrates for optical disks, substrates for magnetic disks, substrates for magneto-optical disks or substrates for photomasks.

A substrate cooling apparatus described in Patent Document 1 has a temperature setter and a cooling plate. The cooling plate includes a heat conduction plate and Peltier elements. A high-temperature substrate before cooling processing is carried to the heat conduction plate. A substrate cooling target temperature and an initial temperature of the heat conduction plate are set in the temperature setter. The initial temperature of the heat conduction plate is not higher than the substrate cooling target temperature.

The heat conduction plate is controlled to be at the set initial temperature until the substrate is carried to the heat conduction plate. When the high-temperature substrate is carried to the heat conduction plate, the heat conduction plate and the substrate are cooled at maximum capacity by the Peltier elements. The cooling at maximum capacity by the Peltier element refers to cooling by driving the Peltier elements with their maximum capacity without adjusting an increase or a decrease of a degree to which cooling is performed depending on outputs of a temperature sensor for the substrate and a temperature sensor for the heat conduction plate.

When the substrate temperature has reached the set substrate cooling target temperature, the substrate is moved to be apart from the cooling plate to a position at which the substrate is not affected by heat generated by the heat conduction plate. Thus, the cooling processing on the substrate is completed. After that, the temperature of the heat conduction plate is restored to the initial temperature in preparation for cooling processing for a subsequent substrate.

[Patent Document 1] JP 7-115058 A

SUMMARY OF INVENTION

Technical Problem

According to the substrate cooling apparatus of Patent Document 1, the high-temperature substrate can be cooled to the substrate cooling target temperature at high speed. However, after the cooling processing, it is necessary to consecutively control the temperature of the heat conduction plate, which has been cooled at the maximum capacity by the Peltier elements, to be restored to the initial temperature. As such, the control becomes complicated, and processing efficiency of the substrate cooling apparatus is reduced.

An object of the present invention is to provide a thermal processing apparatus and a thermal processing method capable of accurately and highly efficiently performing thermal processing on a substrate by simpler control.

Solution to Problem (1) According to one aspect of the present invention, a thermal processing apparatus that performs thermal processing on a substrate includes a plate on which the substrate is placed, a thermal processor arranged to cool or heat the plate, a temperature adjuster that adjusts a temperature of the thermal processor, a temperature detector that detects a temperature of the plate, a control value calculator that calculates a control value that is to be applied to the temperature adjuster in order to maintain the temperature of the plate at a set value, as a control arithmetic value on a basis of the temperature detected by the temperature detector, and a control switch that performs a first control that applies the control arithmetic value calculated by the control value calculator to the temperature adjuster, and a second control that applies a control set value higher than the control arithmetic value calculated by the control value calculator to the temperature adjuster, wherein the control switch switches the first control to the second control when the control arithmetic value calculated by the control value calculator increases to a value not less than a first threshold value, and switches the second control to the first control when the control arithmetic value calculated by the control value calculator decreases to a value less than a second threshold value.

In this thermal processing apparatus, the plate, on which the substrate is placed, is cooled or heated by the thermal processor. The temperature of the thermal processor is adjusted by the temperature adjuster. The temperature of the plate is detected. The control value, which is to be applied to the temperature adjuster in order to maintain the temperature of the plate at the set value, is calculated as the control arithmetic value on the basis of the detected temperature.

When the control arithmetic value is less than the second threshold value, the control arithmetic value calculated to maintain the temperature of the plate at the set value is applied to the temperature adjuster (the first control). Thus, the temperature of the plate is maintained at the set value. On the other hand, when the control arithmetic value increases to the value not less than the first threshold value, the control set value higher than the control arithmetic value is applied to the temperature adjuster (the second control). Thus, the temperature of the plate is restored to the set value in a shorter time. If the control arithmetic value decreases to the value less than the second threshold value, the first control is performed. In the first control, since the change in temperature of the plate is moderate, large overshoot and undershoot do not occur.

With this configuration, readiness and stability of control can be improved by switching between the first control and the second control. As a result, thermal processing for the substrate can be accurately and highly efficiently performed by simpler control.

(2) The control set value may be higher than predetermined first and second threshold values and not higher than a maximum control value relative to the temperature adjuster.

With this configuration, when the control arithmetic value increases to the value not less than the first threshold value, a higher control set value is applied to the temperature adjuster. Thus, the temperature of the plate can be restored to the set value in a shorter time. As a result, the readiness of control can be further improved while the stability of control is maintained.

(3) The first threshold value and the second threshold value may be equal to each other.

In this case, since the control arithmetic value when the first control is switched to the second control is equal to the control arithmetic value when the second control is switched to the first control, the control of the temperature adjuster can be more simplified.

(4) The control value may be a ratio between power that is to be supplied to the thermal processor in order to maintain the temperature of the plate at the set value and maximum power that can be output by the temperature adjuster.

In this case, the first and second threshold values can be set as relative values. As such, the first and second threshold values can easily be set.

(5) The thermal processor may include a Peltier element. In this case, the temperature adjuster can easily adjust the temperature of the thermal processor with higher responsiveness by adjusting the power supplied to the thermal processor.

(6) According to another aspect of the present invention, a thermal processing method for performing thermal processing on a substrate includes the steps of cooling or heating a plate on which the substrate is placed by a thermal processor, adjusting a temperature of the thermal processor by a temperature adjuster, detecting a temperature of the plate, calculating a control value that is to be applied to the temperature adjuster in order to maintain the temperature of the plate at a set value, as a control arithmetic value on a basis of the detected temperature, and performing a first control that applies the calculated control arithmetic value to the temperature adjuster and a second control that applies a control set value higher than the calculated control arithmetic value to the temperature adjuster, wherein the step of performing the first control and the second control includes switching the first control to the second control when the calculated control arithmetic value increases to a value not less than a first threshold value, and switching the second control to the first control when the calculated control arithmetic value decreases to a value less than a second threshold value.

According to this thermal processing method, the plate, on which the substrate is placed, is cooled or heated by the thermal processor. The temperature of the thermal processor is adjusted by the temperature adjuster. The temperature of the plate is detected. The control value, which is to be applied to the temperature adjuster in order to maintain the temperature of the plate at the set value, is calculated as the control arithmetic value.

When the control arithmetic value is less than the second threshold value, the control arithmetic value calculated in order to maintain the temperature of the plate at the set value is applied to the temperature adjuster (the first control). Thus, the temperature of the plate is maintained at the set value. Meanwhile, when the control arithmetic value increases to the value not less than the first threshold value, a control set value higher than the control arithmetic value is applied to the temperature adjuster (the second control). Thus, the temperature of the plate is restored to the set value in a shorter time. When the control arithmetic value decreases to the value less than the second threshold value, the first control is performed. In the first control, since the change in temperature of the plate is moderate, large overshoot and undershoot do not occur.

According to this method, the readiness and stability of control can be improved by switching between the first control and the second control. As a result, the thermal processing for the substrate can be accurately and highly efficiently performed by simpler control.

Advantageous Effects of Invention

According to the present invention, the thermal processing can be accurately and highly efficiently performed on the substrate by simpler control.

DESCRIPTION OF EMBODIMENTS (1) Configuration of Thermal Processing Apparatus

A thermal processing apparatus and a thermal processing method according to an embodiment of the present invention will be described using the drawings. In the following description, a substrate refers to a semiconductor substrate, a substrate for a liquid crystal display, a substrate for a plasma display, a substrate for an optical disk, a substrate for a magnetic disk, a substrate for a magneto-optical disk, a substrate for a photomask, or the like.

Figure 1:
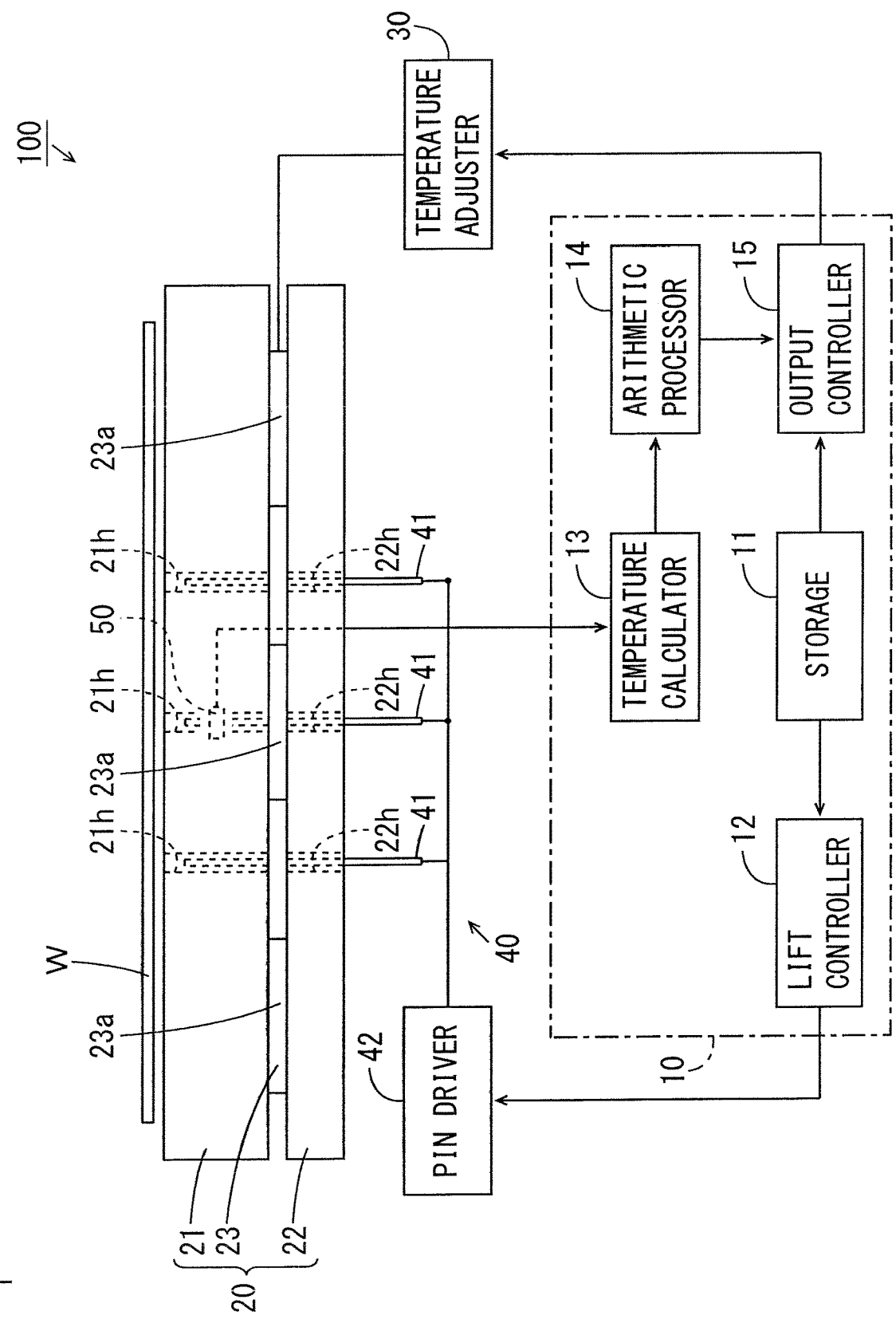
FIG. 1 is a schematic side view showing the configuration of a thermal processing apparatus according to one embodiment of the present invention.
Figure 2:
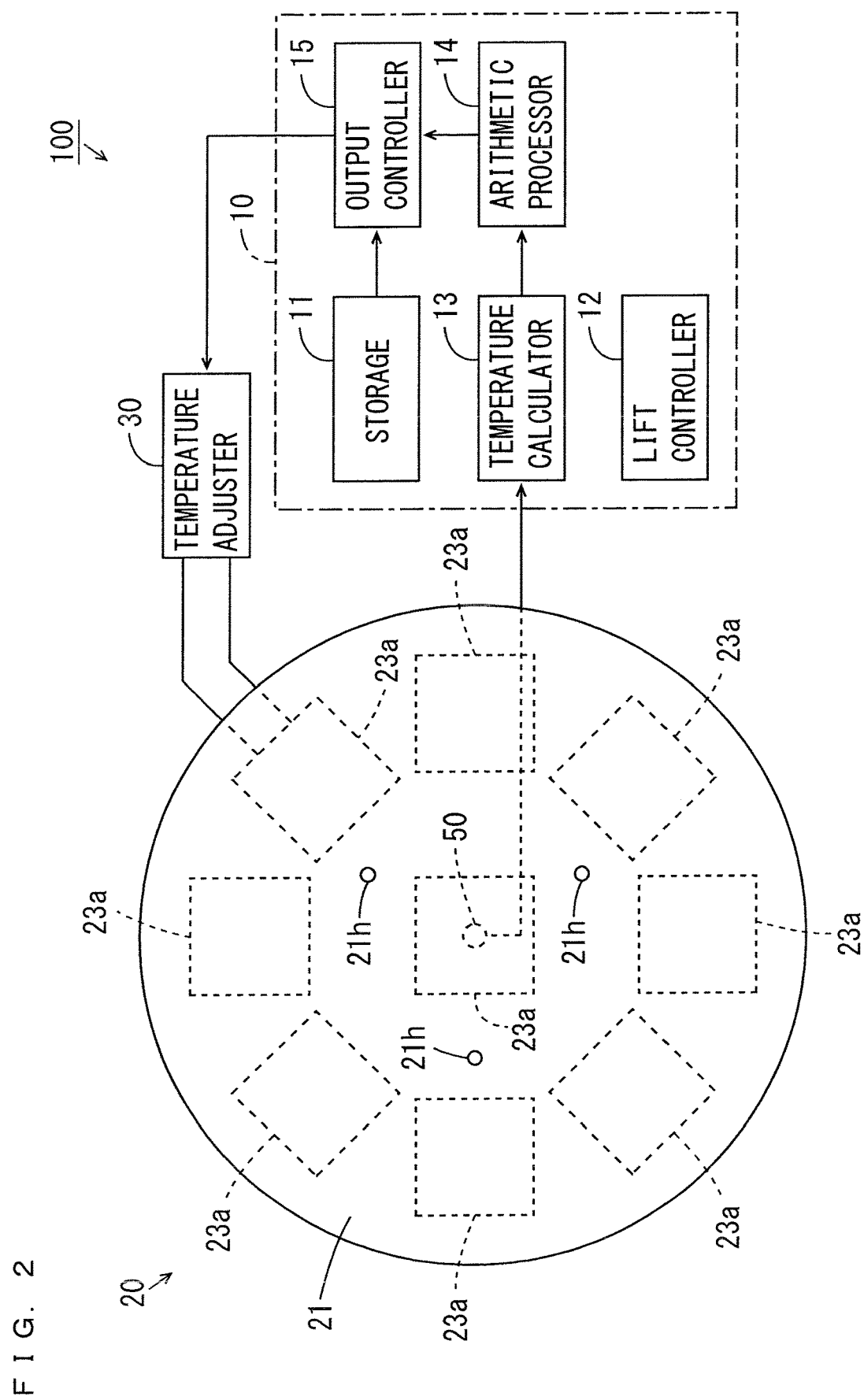
FIG. 2 is a schematic plan view of the thermal processing apparatus of FIG. 1.

FIG. 1 is a schematic side view showing the configuration of a thermal processing apparatus according to one embodiment of the present invention. FIG. 2 is a schematic plan view of the thermal processing apparatus 100 of FIG. 1. As shown in FIG. 1, the thermal processing apparatus 100 includes a controller 10, a plate 20, a temperature adjuster 30, a lifter 40, and a temperature detector 50.

The controller 10 includes a storage 11, a lift controller 12, a temperature calculator 13, an arithmetic processor 14, and an output controller 15. The lift controller 12, the temperature calculator 13, the arithmetic processor 14, and the output controller 15 are implemented by a CPU (Central Processing Unit).

The plate 20 includes an upper plate 21, a lower plate 22, and a thermal processor 23. The upper plate 21 is a heat conduction plate having, for example, a disk-like shape. A substrate W to be subjected to thermal processing is placed on the upper plate 21. A plurality of openings 21h (three openings in this example) are formed in the upper plate 21 to penetrate in a thickness direction.

The lower plate 22 is a heat dissipation plate having, for example, a disk-like shape. A plurality of openings 22$h$ are formed in the lower plate 22 to penetrate in a thickness direction and correspond respectively to the plurality of openings 21$h$ of the upper plate 21. The lower plate 22 is arranged below the upper plate 21 with a center of the lower plate 22 substantially coincident with a center of the upper plate 21. In this case, the plurality of openings 21$h$ of the upper plate 21 and the plurality of openings 22$h$ of the lower plate 22 overlap with each other in a vertical direction.

In this embodiment, the thermal processor 23 includes a plurality of temperature control elements 23$a$ (nine elements in the example of FIG. 2). The thermal processor 23 is arranged between the upper plate 21 and the lower plate 22. In this state, the upper plate 21 and the lower plate 22 are fixed by a fixing member such as screws not shown. Thus, the thermal processor 23 is held by and sandwiched between the upper plate 21 and the lower plate 22.

In this example, each temperature control element 23$a$ is a Peltier element having a cooling surface and a heating surface. Each temperature control element 23$a$ is arranged such that the cooling surface is in contact with the upper plate 21 and the heating surface is in contact with the lower plate 22. In this case, the plate 20 functions as a cooling plate that cools the substrate W by the upper plate 21. Heat generated from the heating surface of each temperature control element 23$a$ is discharged by the lower plate 22 so as not to affect the cooling processing for the substrate W.

Each temperature control element 23$a$ is connected to the temperature adjuster 30. FIGS. 1 and 2 show only the connection between one of the temperature control elements 23$a$ and the temperature adjuster 30, and do not show connections between the other plurality of temperature control elements 23$a$ and the temperature adjuster 30. The temperature adjuster 30 is a power supplier, for example, and supplies power as an output to the temperature control elements 23$a$ on the basis of control by the output controller 15 of the controller 10. Thus, the temperature of the upper plate 21 decreases, and the substrate W placed on the upper plate 21 is cooled to a predetermined temperature.

As shown in FIG. 1, the lifter 40 includes a plurality of lifting pins 41 corresponding to the plurality of openings 21$h$, 22$h$, respectively, and a pin driver 42. The plurality of lifting pins 41 are inserted, respectively, in the plurality of openings 22$h$ and the plurality of openings 21$h$ of the upper plate 21 from below the lower plate 22.

The pin driver 42 is an actuator, for example, and an air cylinder in this example. The pin driver 42 moves the plurality of lifting pins 41 between a lifted position and a lowered position on the basis of control by the lift controller 12 of the controller 10. The lifted position here is a position at which tips of the plurality of lifting pins 41 project further upward than an upper surface of the upper plate 21 through the plurality of openings 21$h$, 22$h$. The lowered position is a position at which the tips of the plurality of lifting pins 41 are positioned further downward than the upper surface of the upper plate 21.

The temperature detector 50 is a temperature detection element having a characteristic value that varies with the temperature of a target to be measured. The temperature detection element may be a thermocouple, a resistance temperature detector or another element. The temperature detector 50 is buried in a substantially central portion of the upper plate 21. It is noted that when the temperature detector 50 is the thermocouple, the characteristic value is a potential difference (thermoelectric power), whereas when the temperature detector 50 is the resistance temperature detector, the characteristic value is electrical resistance. The temperature detector 50 applies a detection value to the temperature calculator 13 of the controller 10 on the basis of the characteristic value depending on the temperature of the upper plate 21.

The storage 11 of the controller 10 stores a set temperature of the upper plate 21 and various information as to temperature control described below. The storage 11 also stores information indicating a time at which the lifting pins 41 are lifted and lowered.

The lift controller 12 controls the pin driver 42 based on the information indicating the time stored in the storage 11 such that the plurality of lifting pins 41 are moved to the lifted position when the substrate W is carried to the plate 20 or when the substrate W is carried out from the plate 20. In this case, the substrate W is moved upward of the upper plate 21 by the plurality of lifting pins 41. In this state, the substrate W is received and transferred between the plurality of lifting pins 41 and a substrate transport device not shown.

Also, the lift controller 12 controls the pin driver 42 based on the information indicating the time stored in the storage 11 such that the plurality of lifting pins 41 are moved to the lowered position during the thermal processing for the substrate W. Thus, the substrate W is placed on the upper plate 21.

The temperature calculator 13 calculates the temperature of the upper plate 21 on the basis of the detection value applied from the temperature detector 50. The arithmetic processor 14 calculates an output (power) that is to be supplied to the thermal processor 23 by the temperature adjuster 30 in order to maintain the upper plate 21 at the set temperature, on the basis of the temperature calculated by the temperature calculator 13. In this example, the set temperature is 23° C. The output controller 15 controls the output, which is to be supplied to the thermal processor 23 by the temperature adjuster 30, on the basis of information as to output control stored in the storage 11 and the result calculated by the arithmetic processor 14.

(2) Temperature Control of Upper Plate

In this example, first of all, the temperature of the upper plate 21 is controlled to be a set temperature (23° C. in this example). Then, the substrate W heated to a high temperature by a heating processor not shown is placed on the upper plate 21. As such, the temperature of the upper plate 21 sharply increases from the set temperature. Even in such a case, the temperature adjuster 30 is controlled such that the temperature of the upper plate 21 is restored to the set temperature. In this control, an output rate from the temperature adjuster 30 to the thermal processor 23 is adjusted. The output rate here is a ratio between an output to be supplied to the thermal processor 23 in order to maintain the upper plate 21 at the set temperature and an a maximum output that can be supplied by the temperature adjuster 30.

In the above-described control, it is desirable that readiness and stability are improved, i.e., the temperature of the upper plate 21 is restored to the set temperature in a period of time as short as possible with an excess amount (overshoot and undershoot) as small as possible. Normally, when such control is performed, feedback control is used.

Figure 3:
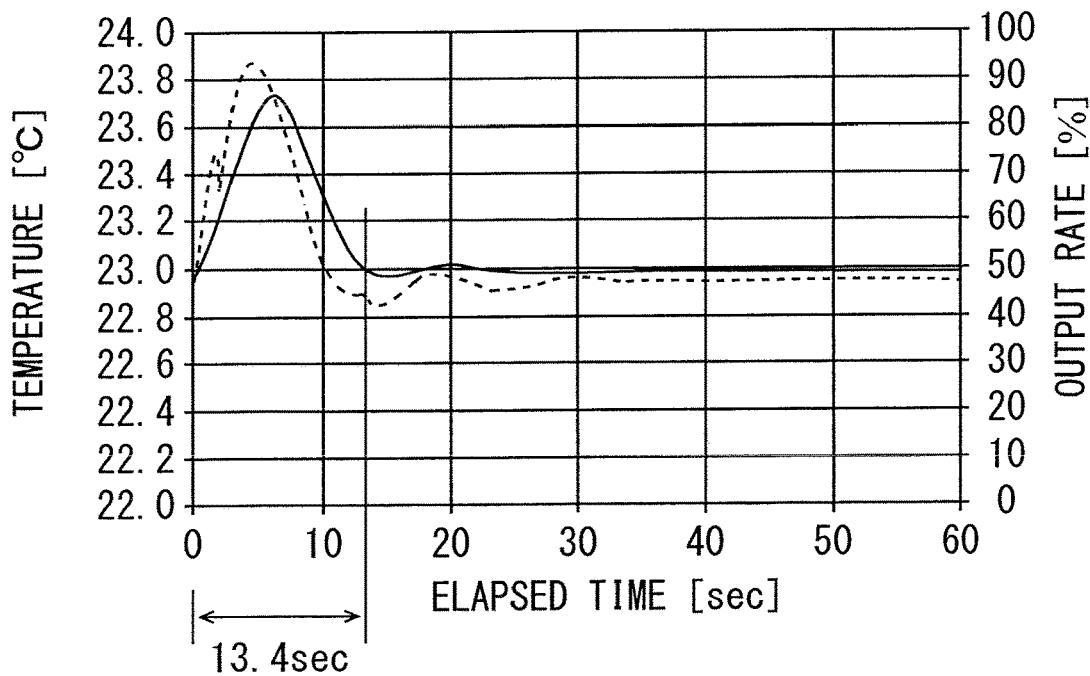
FIG. 3 is a graph showing temperature control of an upper plate in a comparative example 1.
Figure 4:
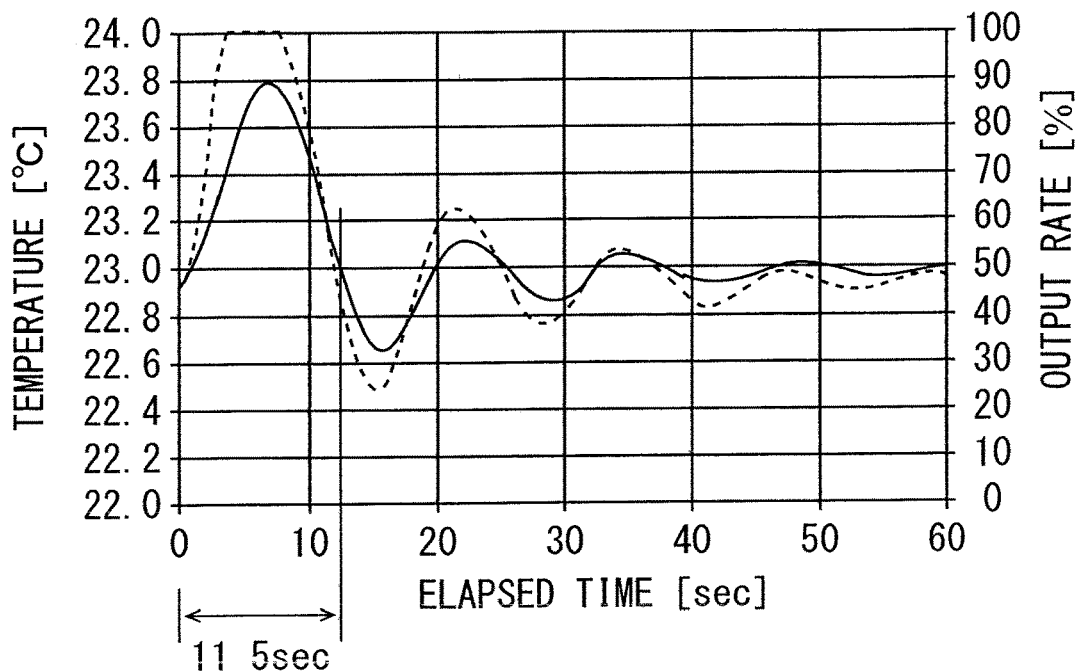
FIG. 4 is a graph showing temperature control of the upper plate in a comparative example 2.

FIGS. 3 and 4 are graphs showing temperature controls of the upper plate 21 in comparative examples 1 and 2, respectively. In each of FIGS. 3 and 4, the abscissa of represents elapsed time, and the ordinates represent the temperature of the upper plate 21 and the output rate of the temperature adjuster 30. In FIGS. 3 and 4, changes in temperature of the upper plate 21 are denoted by the solid line, and the output rate of the temperature adjuster 30 is denoted by the dotted line. In the comparative examples 1 and 2, PID (Proportional-Integral-Differential) control is performed as the feedback control. A gain of the PID control in the comparative example 2 is larger than a gain of the PID control in the comparative example 1.

In the comparative example 1, as shown in FIG. 3, the substrate W is placed on the upper plate 21 at the initial point of time. Then, the temperature of the upper plate 21 increases from the set temperature as denoted by the solid line. In this case, the output rate increases to reduce the change in temperature of the upper plate 21 as denoted by the dotted line. Thus, the temperature of the upper plate 21 decreases and converges near the set temperature as denoted by the solid line. Also, the output rate decreases with the change in temperature of the upper plate 21 and converges to a certain value as denoted by the dotted line.

In the comparative example 2, as shown in FIG. 4, the substrate W is placed on the upper plate 21 at the initial point of time. Then, the temperature of the upper plate 21 increases from the set temperature as denoted by the solid line. In this case, the output rate increases to reduce the change in temperature of the upper plate 21 as denoted by the dotted line. The output rate temporarily reaches 100% in this example. Thus, the temperature of the upper plate 21 decreases in a comparatively shorter time, and converges near the set temperature while repeatedly fluctuating due to overshoot and undershoot as denoted by the solid line. Also, the output rate decreases with the change in temperature of the upper plate 21, and converges to a certain value while repeatedly fluctuating as denoted by the dotted line.

In the comparative example 1, while overshoot of the temperature of the upper plate 21 hardly occurs, it requires a comparatively longer time (13.4 seconds in this example) for the temperature of the upper plate 21 to be restored to the set temperature after the substrate W is placed on the upper plate 21. On the other hand, in the comparative example 2, while it takes a comparatively shorter time (11.5 seconds in this example) for the temperature of the upper plate 21 to be restored to the set temperature after the substrate W is placed on the upper plate 21, large overshoot and undershoot of the temperature of the upper plate 21 occur.

As described above, based on the comparison between the comparative examples 1 and 2, the readiness and the stability are in a trade-off relationship in the normal feedback control, and it is difficult to balance improved readiness and improved stability only by adjusting the gain. Thus, the controller 10 performs the following control to balance the improved readiness and the improved stability in this embodiment.

Figure 5:
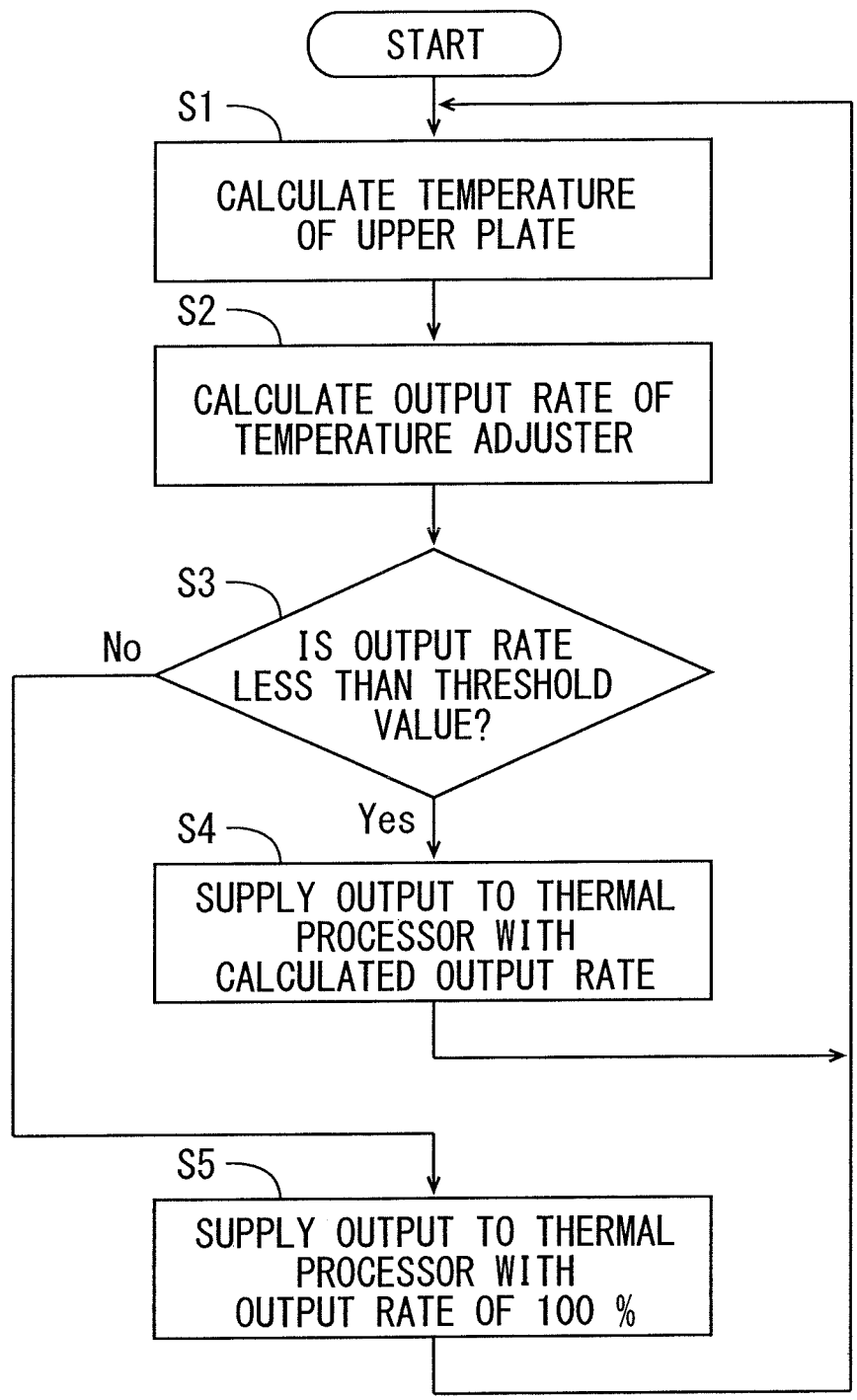
FIG. 5 is a flowchart showing temperature control processing of the upper plate in the embodiment of the present invention.

FIG. 5 is a flowchart showing temperature control processing of the upper plate 21 in the embodiment of the present invention. In the inventive example, a preset threshold value of an output rate of the temperature adjuster 30 is stored in the storage 11. The threshold value is determined based on the set temperature of the upper plate 21, the size of the substrate W, a maximum output of the temperature adjuster 30, and the like. The threshold value is 70% in this example. The temperature control processing by the controller 10 will now be described with reference to FIGS. 1, 2, and 5.

First of all, the temperature calculator 13 calculates temperature of the upper plate 21 (step S1). Then, the arithmetic processor 14 calculates an output rate for maintaining the temperature of the upper plate 21 at a set value using feedback control (step S2). The output controller 15 subsequently determines whether the calculated output rate is less than the threshold value (step S3).

If the calculated output rate is less than the threshold value in step S3, the output controller 15 supplies an output to the thermal processor 23 with the calculated output rate (step S4). In this case, feedback control to maintain the temperature of the upper plate 21 at the set value is performed. After that, the controller 10 returns to the processing in step S1.

On the other hand, if the calculated output rate is not less than the threshold value in step S3, the output controller 15 supplies an output to the thermal processor 23 with an output rate of 100% (step S5). In this case, feedforward control to supply the maximum output of the temperature adjuster 30 to the thermal processor 23 is performed. After that, the controller 10 returns to the processing in step S1.

After the processing in steps S4, S5, the processing in steps S1 to S5 are repeated. In this control, if the calculated output rate is less than the threshold value, the feedback control is performed, whereas if the output rate is not less than the threshold value, the feedforward control is performed.

Figure 6:
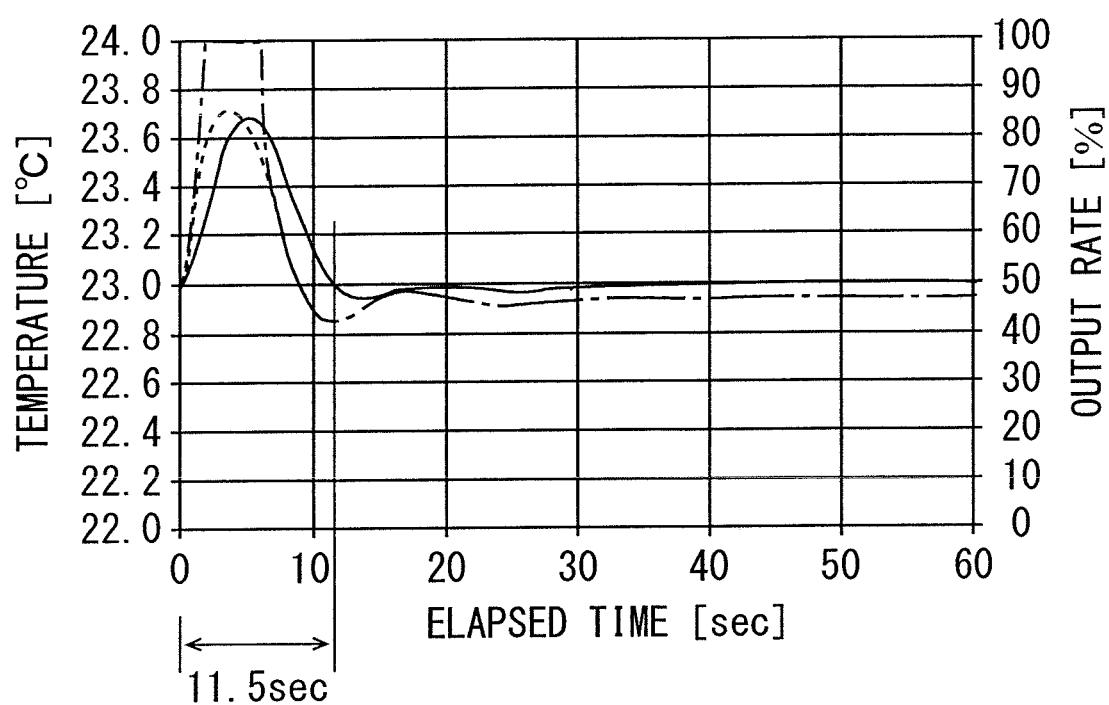
FIG. 6 is a graph showing temperature control of the upper plate in an inventive example.

FIG. 6 is a graph showing the temperature control of the upper plate 21 in the inventive example. In FIG. 6, the abscissa represents elapsed time, and the ordinates represent the temperature of the upper plate 21 and the output rate of the temperature adjuster 30. Also, in FIG. 6, a change in temperature of the upper plate 21 is denoted by the solid line, the calculated output rate is denoted by the dotted line, and an output rate used in the actual control (hereinafter referred to as the actual output rate) is denoted by the dot and dashed line.

As shown in FIG. 6, the substrate W is placed on the upper plate 21 at the initial point of time. Then, the temperature of the upper plate 21 increases from a set temperature as denoted by the solid line. Thus, feedback control is performed to reduce the change in temperature of the upper plate 21. In this case, the calculated output rate of the temperature adjuster 30 increases as denoted by the dotted line. Similarly, the actual output rate also increases as denoted by the dot and dashed line. Note that the feedback control in the inventive example is PID control, and a gain of the PID control in the inventive example is equal to the gain of the PID control in the comparative example 1.

If the calculated output rate is not less than the threshold value (70% in this example), the temperature control is switched from the feedback control to the feedforward control, and the actual output rate reaches 100%. In this case, cooling processing for the upper plate 21 is performed at an output higher than the output in the normal feedback control. Thus, the temperature of the upper plate 21 sharply decreases as denoted by the solid line.

After that, the actual output rate decreases with the change in temperature of the upper plate 21 as denoted by the dot and dashed line. If the calculated output rate is less than the threshold value, the temperature control is switched from the feedforward control to the feedback control, and the actual output rate coincides with the calculated output rate. In this case, the temperature of the upper plate 21 converges near the set temperature by the normal feedback control as denoted by the solid line. Also, the actual output rate and the calculated output rate converge to a certain value with the change in temperature of the upper plate 21 as denoted by the dot and dashed line.

In the inventive example, overshoot and undershoot of the temperature of the upper plate 21 hardly occur, and the temperature of the upper plate 21 is restored to the set temperature in a comparatively shorter time (11.5 seconds in this example) after the substrate W is placed on the upper plate 21. In this way, in the above-described control, the readiness and stability are improved compared to the normal feedback control.

(3) Effects

In the thermal processing apparatus 100 according to this embodiment, when the output rate is less than the threshold value, the feedback control is performed to apply to the temperature adjuster 30 the output rate calculated in order to maintain the temperature of the upper plate 21 at the set temperature. Thus, the temperature of the upper plate 21 is maintained at the set temperature.

On the other hand, when the output rate increases to a value not less than the threshold value, the feedforward control is performed to apply the output rate of 100% to the temperature adjuster 30. Thus, the temperature of the upper plate 21 is restored to the set temperature in a shorter time. If the output rate decreases to a value less than the threshold value, the feedback control is performed. In the feedback control, since the change in temperature of the upper plate 21 is moderate, large overshoot and undershoot do not occur.

With this configuration, the readiness and stability of control can be improved by switching between the feedback control and the feedforward control. As a result, the thermal processing for the substrate W can be accurately and highly efficiently performed by simple control.

(4) Other Embodiments (a) While the plate 20 is a cooling plate that performs cooling processing on the substrate W in the above-described embodiment, the present invention is not limited to this. The plate 20 may be a hot plate that performs heating processing on the substrate W. In this case, each temperature control element 23a of the thermal processor 23 is arranged such that the heating surface is in contact with the upper plate 21 and the cooling surface is in contact with the lower plate 22. Alternatively, the temperature control element 23a may be a heater instead of the Peltier element.

Alternatively, the temperature control element 23a may be a pipe that circulates a heat medium such as pure water. In this case, the temperature adjuster 30 is a heat medium supplier that supplies the heat medium to the pipe.

(b) While the maximum output of the temperature adjuster 30 is preferably supplied to the thermal processor 23 when the calculated output rate is not less than the threshold value in the above-described embodiment, the present invention is not limited to this. When the calculated output rate is not less than the threshold value, an output that is sufficiently larger than the threshold value may be supplied to the thermal processor 23. In this case, the output, which is to be supplied to the thermal processor 23 when the calculated output rate is not less than the threshold value, is stored in the storage 11 in advance as information as to the temperature control of the upper plate 21.

(c) While the threshold value when the feedback control is switched to the feedforward control is preferably equal to the threshold value when the feedforward control is switched to the feedback control in the above-described embodiment, the present invention is not limited to this. The threshold value when the feedback control is switched to the feedforward control may be different from the threshold value when the feedforward control is switched to the feedback control. In this case, two threshold values are stored in the storage 11 in advance as the information as to the temperature control of the upper plate 21.

(d) While the output rate being a relative value is preferably calculated as a control value to be applied to the temperature adjuster 30 in the above-described embodiment, the present invention is not limited to this. An output amount being an absolute value may be calculated as the control value to be applied to the temperature adjuster 30.

(5) Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiment, the substrate W is an example of a substrate, the thermal processing apparatus 100 is an example of a thermal processing apparatus, the upper plate 21 is an example of a plate, the thermal processor 23 is an example of a thermal processor, and the temperature adjuster 30 is an example of a temperature adjuster. The temperature detector 50 is an example of a temperature detector, the arithmetic processor 14 is an example of a control value calculator, the output controller 15 is an example of a control switch, and the temperature control element 23a is an example of a Peltier element.

As each of various elements recited in the claims, various other elements having configurations or functions described in the claims can be also used.

INDUSTRIAL APPLICABILITY

The present invention can effectively be utilized for thermal processing for various substrates.

The invention claimed is:

1. A thermal processing apparatus that performs thermal processing on a substrate, comprising:
   a plate on which the substrate is placed;
   a thermal processor arranged to cool or heat the plate;
   a temperature adjuster that receives a control value and adjusts a temperature of the thermal processor based on the control value;
   a temperature detector that detects a temperature of the plate;
   a control value calculator that calculates the control value that is to be applied to the temperature adjuster in order to maintain the temperature of the plate at a set value, as a control arithmetic value indicating a magnitude of power, on a basis of the temperature detected by the temperature detector; and
   a control switch that performs a first control that applies the control arithmetic value calculated by the control value calculator to the temperature adjuster as the control value, and a second control that applies a control set value higher than the control arithmetic value calculated by the control value calculator to the temperature adjuster as the control value,
   wherein the control switch switches from the first control to the second control when the control arithmetic value calculated by the control value calculator increases to a value not less than a first threshold value, and switches from the second control to the first control before the temperature of the plate reaches the set value when the control arithmetic value calculated by the control value calculator decreases to a value less than a second threshold value.

2. The thermal processing apparatus according to claim 1, wherein the control set value in the second control is higher than the predetermined first and second threshold values and not higher than a maximum control value relative to the temperature adjuster.

3. The thermal processing apparatus according to claim 1, wherein the first threshold value and the second threshold value are equal to each other.

4. The thermal processing apparatus according to claim 1, wherein the control set value is a ratio between power that is to be supplied to the thermal processor in order to maintain the temperature of the plate at the set value and maximum power that can be output by the temperature adjuster.

5. The thermal processing apparatus according to claim 1, wherein the thermal processor includes a Peltier element.

6. A thermal processing method for performing thermal processing on a substrate, comprising:
    cooling or heating a plate on which the substrate is placed by a thermal processor;
    adjusting a temperature of the thermal processor by a temperature adjuster based on a control value received by the temperature adjuster;
    detecting a temperature of the plate;
    calculating the control value that is to be applied to the temperature adjuster in order to maintain the temperature of the plate at a set value, as a control arithmetic value indicating a magnitude of power, on a basis of the detected temperature; and
    performing a first control that applies the calculated control arithmetic value to the temperature adjuster as the control value, and a second control that applies a control set value higher than the calculated control arithmetic value to the temperature adjuster as the control value,
    wherein the performing of the first control and the second control includes switching from the first control to the second control when the calculated control arithmetic value increases to a value not less than a first threshold value, and switching from the second control to the first control before the temperature of the plate reaches the set value when the calculated control arithmetic value decreases to a value less than a second threshold value.

7. The thermal processing apparatus according to claim 1, wherein the control arithmetic value is a ratio between power that is to be supplied to the thermal processor in order to maintain the temperature of the plate at the set value and maximum power that can be output by the temperature adjuster.

8. A thermal processing apparatus that performs thermal processing on a substrate, comprising:
    a plate on which the substrate is placed;
    a thermal processor arranged to cool or heat the plate;
    a temperature adjuster that receives a control value and adjusts a temperature of the thermal processor based on the control value;
    a temperature detector that detects a temperature of the plate;
    a hardware processor configured to calculate the control value that is to be applied to the temperature adjuster in order to maintain the temperature of the plate at a set value, as a control arithmetic value indicating a magnitude of power, on a basis of the temperature detected by the temperature detector, and perform a first control that applies the calculated control arithmetic value to the temperature adjuster as the control value, and a second control that applies a control set value higher than the calculated control arithmetic value to the temperature adjuster as the control value,
    wherein the hardware processor is configured to switch from the first control to the second control when the calculated control arithmetic value increases to a value not less than a first threshold value, and switch from the second control to the first control before the temperature of the plate reaches the set value when the calculated control arithmetic value decreases to a value less than a second threshold value.

* * * * *